(12) United States Patent
Chen

(10) Patent No.: US 9,030,886 B2
(45) Date of Patent: May 12, 2015

(54) MEMORY DEVICE AND DRIVING METHOD THEREOF

(71) Applicant: United Microelectronics Corp., Hsin-Chu (TW)

(72) Inventor: Hsin-Wen Chen, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 242 days.

(21) Appl. No.: 13/707,601

(22) Filed: Dec. 7, 2012

(65) Prior Publication Data

US 2014/0160840 A1    Jun. 12, 2014

(51) Int. Cl.
| | | |
|---|---|---|
| G11C 7/22 | (2006.01) | |
| G11C 11/40 | (2006.01) | |
| G11C 5/14 | (2006.01) | |
| G11C 7/02 | (2006.01) | |
| G11C 11/417 | (2006.01) | |
| G11C 11/419 | (2006.01) | |

(52) U.S. Cl.
CPC ...... *G11C 11/40* (2013.01); *G11C 5/14* (2013.01); *G11C 7/02* (2013.01); *G11C 11/417* (2013.01); *G11C 11/419* (2013.01)

(58) Field of Classification Search
USPC ............ 365/189.011, 189.11, 210.12, 185.24
See application file for complete search history.

(56) References Cited

U.S. PATENT DOCUMENTS

| | | | |
|---|---|---|---|
| 3,663,828 A | 5/1972 | Low | |
| 3,818,402 A | 6/1974 | Golaski | |
| 4,163,944 A | 8/1979 | Chambers | |
| 4,245,355 A | 1/1981 | Pascoe | |
| 4,409,608 A | 10/1983 | Yoder | |
| 4,816,784 A | 3/1989 | Rabjohn | |
| 5,159,205 A | 10/1992 | Gorecki | |
| 5,208,725 A | 5/1993 | Akcasu | |
| 5,212,653 A | 5/1993 | Tanaka | |
| 5,406,447 A | 4/1995 | Miyazaki | |
| 5,446,309 A | 8/1995 | Adachi | |
| 5,583,359 A | 12/1996 | Ng | |
| 5,637,900 A | 6/1997 | Ker | |
| 5,760,456 A | 6/1998 | Grzegorek | |
| 5,768,207 A * | 6/1998 | Raad et al. ............ 365/226 |
| 5,808,330 A | 9/1998 | Rostoker | |
| 5,923,225 A | 7/1999 | De Los Santos | |
| 5,959,820 A | 9/1999 | Ker | |
| 6,008,102 A | 12/1999 | Alford | |
| 6,081,146 A | 6/2000 | Shiochi | |
| 6,172,378 B1 | 1/2001 | Hull | |
| 6,194,739 B1 | 2/2001 | Ivanov | |
| 6,246,271 B1 | 6/2001 | Takada | |
| 6,285,578 B1 | 9/2001 | Huang | |
| 6,291,872 B1 | 9/2001 | Wang | |
| 6,370,372 B1 | 4/2002 | Molnar | |
| 6,407,412 B1 | 6/2002 | Iniewski | |
| 6,427,226 B1 | 7/2002 | Mallick | |

(Continued)

*Primary Examiner* — Pho M Luu

(74) *Attorney, Agent, or Firm* — Winston Hsu; Scott Margo

(57) ABSTRACT

A memory device includes a memory array, an array gap, a voltage provider, and a voltage divider. The voltage provider is disposed in the array gap and coupled to a column of memory cells of the memory array for providing a first voltage to the column of memory cells when a memory cell of the column is selected at a write cycle. The voltage provider is coupled to the voltage provider and the column of memory cells for providing a second voltage lower than the first voltage to the column of memory cells when the memory of the column is half selected at the write cycle.

10 Claims, 15 Drawing Sheets

(56) References Cited

U.S. PATENT DOCUMENTS

| | | |
|---|---|---|
| 6,448,858 B1 | 9/2002 | Helms |
| 6,452,442 B1 | 9/2002 | Laude |
| 6,456,221 B2 | 9/2002 | Low |
| 6,461,914 B1 | 10/2002 | Roberts |
| 6,480,137 B2 | 11/2002 | Kulkarni |
| 6,483,188 B1 | 11/2002 | Yue |
| 6,486,765 B1 | 11/2002 | Katayanagi |
| 6,509,805 B2 | 1/2003 | Ochiai |
| 6,518,165 B1 | 2/2003 | Han |
| 6,521,939 B1 | 2/2003 | Yeo |
| 6,545,547 B2 | 4/2003 | Fridi |
| 6,560,306 B1 | 5/2003 | Duffy |
| 6,588,002 B1 | 7/2003 | Lampaert |
| 6,593,838 B2 | 7/2003 | Yue |
| 6,603,360 B2 | 8/2003 | Kim |
| 6,608,363 B1 | 8/2003 | Fazelpour |
| 6,611,223 B2 | 8/2003 | Low |
| 6,625,077 B2 | 9/2003 | Chen |
| 6,630,897 B2 | 10/2003 | Low |
| 6,639,298 B2 | 10/2003 | Chaudhry |
| 6,653,868 B2 | 11/2003 | Oodaira |
| 6,668,358 B2 | 12/2003 | Friend |
| 6,700,771 B2 | 3/2004 | Bhattacharyya |
| 6,720,608 B2 | 4/2004 | Lee |
| 6,724,677 B1 | 4/2004 | Su |
| 6,756,656 B2 | 6/2004 | Lowther |
| 6,795,001 B2 | 9/2004 | Roza |
| 6,796,017 B2 | 9/2004 | Harding |
| 6,798,011 B2 | 9/2004 | Adan |
| 6,810,242 B2 | 10/2004 | Molnar |
| 6,822,282 B2 | 11/2004 | Randazzo |
| 6,822,312 B2 | 11/2004 | Sowlati |
| 6,833,756 B2 | 12/2004 | Ranganathan |
| 6,841,847 B2 | 1/2005 | Sia |
| 6,847,572 B2 | 1/2005 | Lee |
| 6,853,272 B1 | 2/2005 | Hughes |
| 6,876,056 B2 | 4/2005 | Tilmans |
| 6,885,534 B2 | 4/2005 | Ker |
| 6,901,126 B1 | 5/2005 | Gu |
| 6,905,889 B2 | 6/2005 | Lowther |
| 6,909,149 B2 | 6/2005 | Russ |
| 6,927,664 B2 | 8/2005 | Nakatani |
| 6,958,522 B2 | 10/2005 | Clevenger |
| 7,009,252 B2 | 3/2006 | Lin |
| 7,027,276 B2 | 4/2006 | Chen |
| 7,205,612 B2 | 4/2007 | Cai et al. |
| 7,262,069 B2 | 8/2007 | Chung |
| 7,352,645 B2 * | 4/2008 | Sforzin et al. ............... 365/227 |
| 7,365,627 B2 | 4/2008 | Yen |
| 7,368,761 B1 | 5/2008 | Lai |
| 7,369,452 B2 * | 5/2008 | Kenkare et al. ............ 365/225.7 |
| 7,405,642 B1 | 7/2008 | Hsu |
| 7,613,031 B2 | 11/2009 | Hanafi |
| 7,672,100 B2 | 3/2010 | Van Camp |
| 7,817,479 B2 * | 10/2010 | Ro et al. .................. 365/189.09 |
| 8,416,632 B2 * | 4/2013 | Kim et al. ................ 365/189.09 |
| 2002/0019123 A1 | 2/2002 | Ma |
| 2002/0036545 A1 | 3/2002 | Fridi |
| 2002/0188920 A1 | 12/2002 | Lampaert |
| 2003/0076636 A1 | 4/2003 | Ker |
| 2003/0127691 A1 | 7/2003 | Yue |
| 2003/0183403 A1 | 10/2003 | Kluge |
| 2005/0068112 A1 | 3/2005 | Glenn |
| 2005/0068113 A1 | 3/2005 | Glenn |
| 2005/0087787 A1 | 4/2005 | Ando |
| 2006/0006431 A1 | 1/2006 | Jean |
| 2006/0108694 A1 | 5/2006 | Hung |
| 2006/0267102 A1 | 11/2006 | Cheng |
| 2007/0102745 A1 | 5/2007 | Hsu |
| 2007/0210416 A1 | 9/2007 | Hsu |
| 2007/0234554 A1 | 10/2007 | Hung |
| 2007/0246801 A1 | 10/2007 | Hung |
| 2007/0249294 A1 | 10/2007 | Wu |
| 2007/0296055 A1 | 12/2007 | Yen |
| 2008/0094166 A1 | 4/2008 | Hsu |
| 2008/0185679 A1 | 8/2008 | Hsu |
| 2008/0189662 A1 | 8/2008 | Nandy |
| 2008/0200132 A1 | 8/2008 | Hsu |
| 2008/0299738 A1 | 12/2008 | Hsu |
| 2008/0303623 A1 | 12/2008 | Hsu |
| 2009/0029324 A1 | 1/2009 | Clark |
| 2009/0201625 A1 | 8/2009 | Liao |
| 2010/0279484 A1 | 11/2010 | Wang |
| 2011/0019464 A1 | 1/2011 | Mcmullan |

* cited by examiner

MEMORY DEVICE AND DRIVING METHOD THEREOF

BACKGROUND OF THE INVENTION

1. Field of the Invention

The present invention is related to a memory device, and more particularly, to a memory device having write and/or read assist function.

2. Description of the Prior Art

FIG. 1 is a prior art memory cell array 100. The memory cell array 100 includes a plurality of memory cells 102, a plurality of word lines 104, a plurality of pairs of bit lines 106 and bit line bars 108. Each word line 104 is coupled to corresponding memory cells 102 in the same row, and each pair of bit line 106 and bit line bar 108 is coupled to corresponding memory cells 102 in the same column.

In FIG. 1, a word line 1042 is at a high logic level and a pair of bit line 1062 and bit line bar 1082 is at inverse logic levels in order to write a select cell (active cell) 1022 of the memory cells 102 at a write cycle. Memory cells 1024 in the same row with the memory cell 1022 are half select cells, and memory cells 102 coupled to word lines 104 other than the word line 1042 are off cells.

FIG. 2 is a prior art diagram illustrating butterfly curves of a memory cell 102. Curve 202 indicates voltage transfer characteristic when the memory cell 1024 is half selected, namely, the word line 1042 is at the high logic level and the bit line 106 and bit line bar 108 coupled to the memory cell 1024 are also at the high logic level. Curve 204 indicates voltage transfer characteristic when the memory cell 102 is an off cell, namely, a word line 104 coupled to the memory cell 102 is at a low logic level. As shown in FIG. 2, static noise margin (SNM) 206 is smaller when the memory cell 1024 is half selected comparing with the condition when the memory cell 102 is the off cell.

Thus, how to increase SNM when the memory cell 102 is half selected while maintaining relatively good write margin for the selected cell 1022 is an issue worth exploring.

SUMMARY OF THE INVENTION

An embodiment of the invention discloses a memory device comprising a memory array, an array gap, a voltage provider, and a voltage divider. The memory array comprises a plurality of columns of memory cells. The voltage provider is disposed in the array gap coupled to a column of memory cells of the plurality of columns of memory cells for providing a first voltage to the column of memory cells when a logic level of a bit line coupled to the column of memory cells and a logic level of a bit line bar coupled to the column of memory cells are inverse to one another. The voltage divider is coupled to the voltage provider and the column of memory cells for providing a second voltage lower than the first voltage to the column of memory cells when the logic level of the bit line and the logic level of the bit line bar are substantially the same.

Another embodiment of the invention discloses a memory device comprising a memory array, an array gap, a first voltage provider, and a second voltage provider. The memory array comprises a plurality of columns of memory cells. The first voltage provider is disposed in the array gap coupled to a column of memory cells of the plurality of columns of memory cells for providing a first voltage to the column of memory cells when a logic level of a bit line coupled to the column of memory cells and a logic level of a bit line bar coupled to the column of memory cells are inverse to one another. The second voltage provider is coupled to the column of memory cells for providing a second voltage lower than the first voltage to the column of memory cells when the logic level of the bit line and the logic level of the bit line bar are substantially the same.

Another embodiment of the invention discloses a method for driving a memory device. The memory device comprises a memory array and an array gap. A column of memory cells of the memory array is coupled to a predetermined voltage source disposed in the array gap. The method comprises using the predetermined voltage source to provide a first predetermined voltage when a logic level of a bit line coupled to the column of memory cells and a logic level of a bit line bar coupled to the column of memory cells are substantially the same, and using the predetermined voltage source to provide a second predetermined voltage different from the first predetermined voltage when the logic level of the bit line coupled to the column of memory cells and the logic level of the bit line bar coupled to the column of memory cells are inverse to one another.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
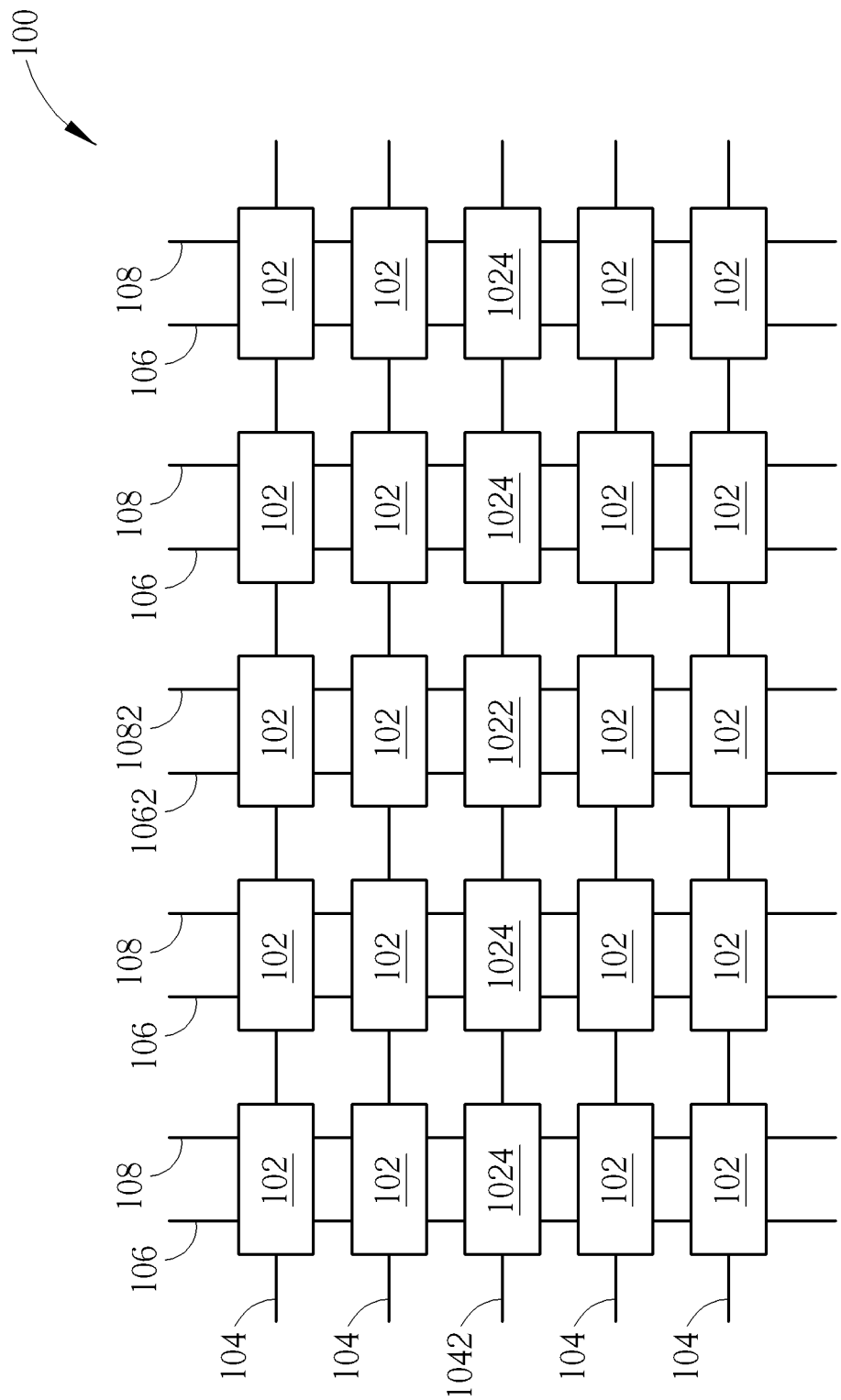
FIG. 1 is a prior art memory cell array.
Figure 2:
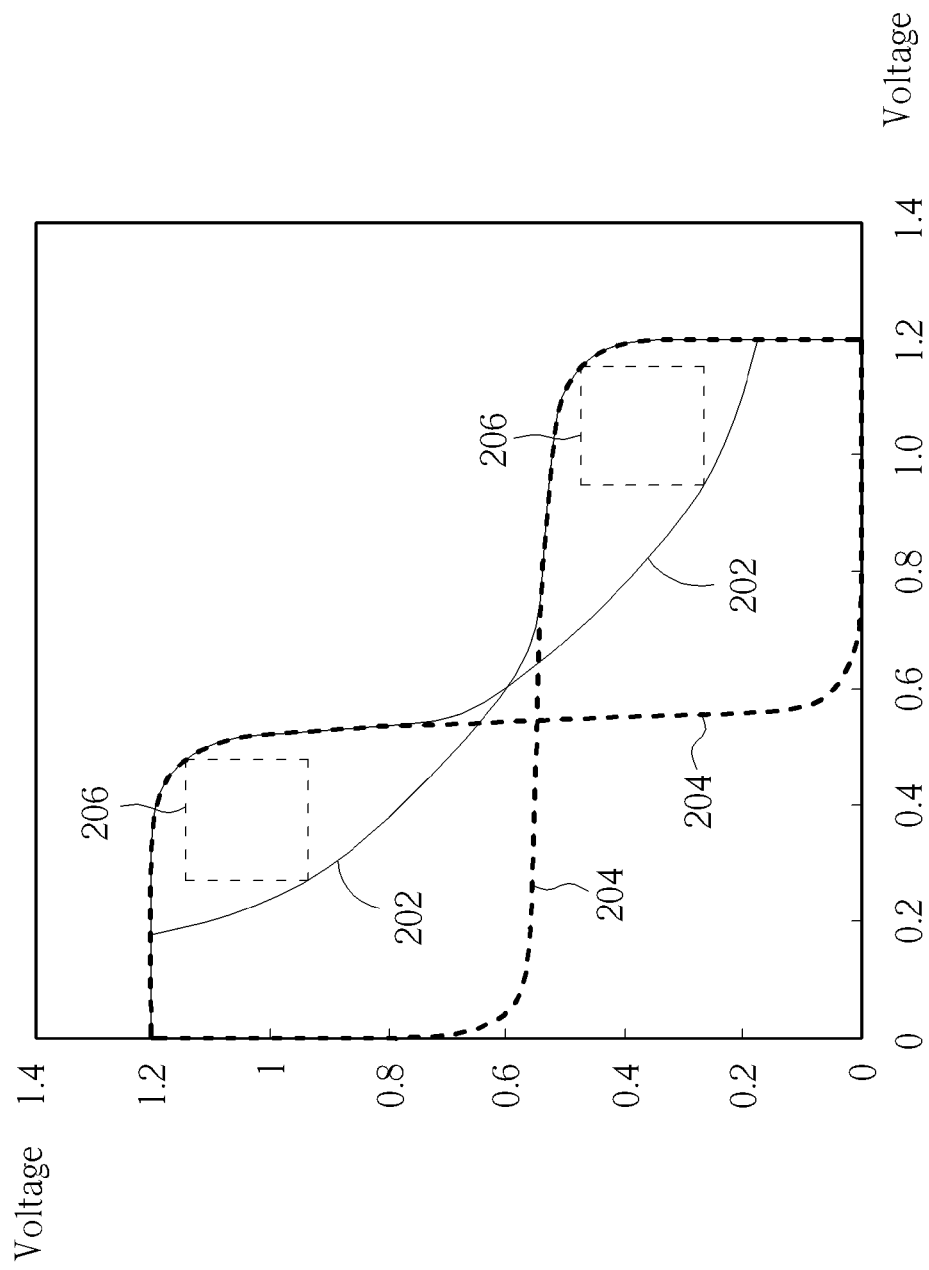
FIG. 2 is a prior art diagram illustrating butterfly curves of a memory cell.
Figure 3:
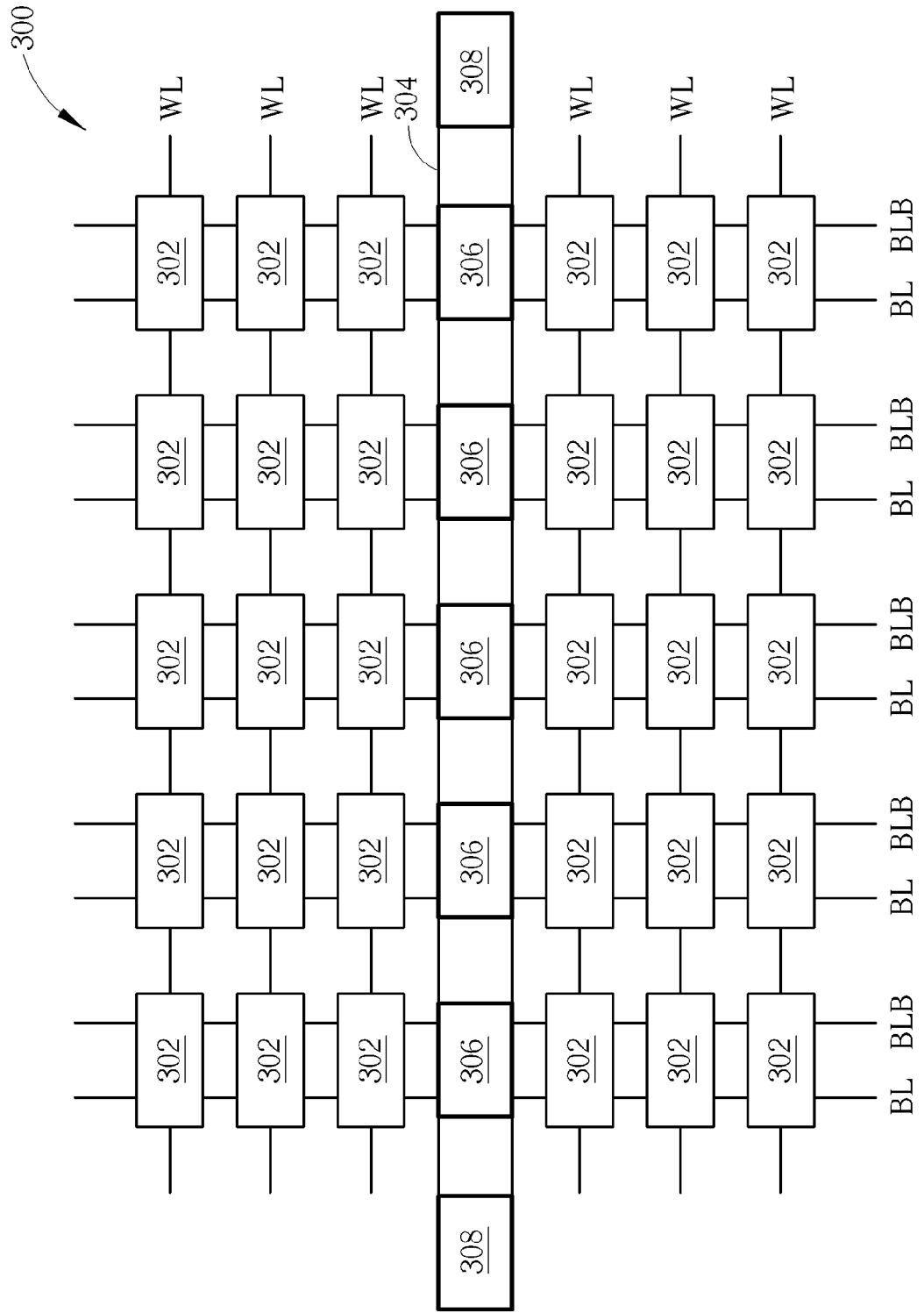
FIG. 3 is a diagram illustrating a memory device according to an embodiment of the present invention.

FIG. 3 is a diagram illustrating a memory device 300 according to an embodiment of the present invention. The memory device 300 may include a memory array, which includes a plurality of columns of memory cells 302, an array gap 304, a plurality of word lines WL and a plurality of pairs of bit lines BL and bit line bars BLB. Each word line WL is coupled to corresponding memory cells 302 in the same row, and each pair of bit line BL and bit line bar BLB is coupled to corresponding memory cells 302 in the same column. The memory device 300 also includes a plurality of voltage providers 306 and a plurality of voltage dividers 308. Each voltage provider 306 may be disposed in the array gap 304 and is coupled to a column of memory cells 302 of the memory array. Each voltage divider 308 may be disposed in an edge of the memory array or be disposed in the array gap 304 and is coupled to the voltage provider 306 and the column of memory cells 302. Each memory cell 302 may be a non-volatile memory cell, an SRAM cell, a 4T SRAM cell, a 6T SRAM cell, an 8T SRAM cell, or other types of cell.

Figure 4:
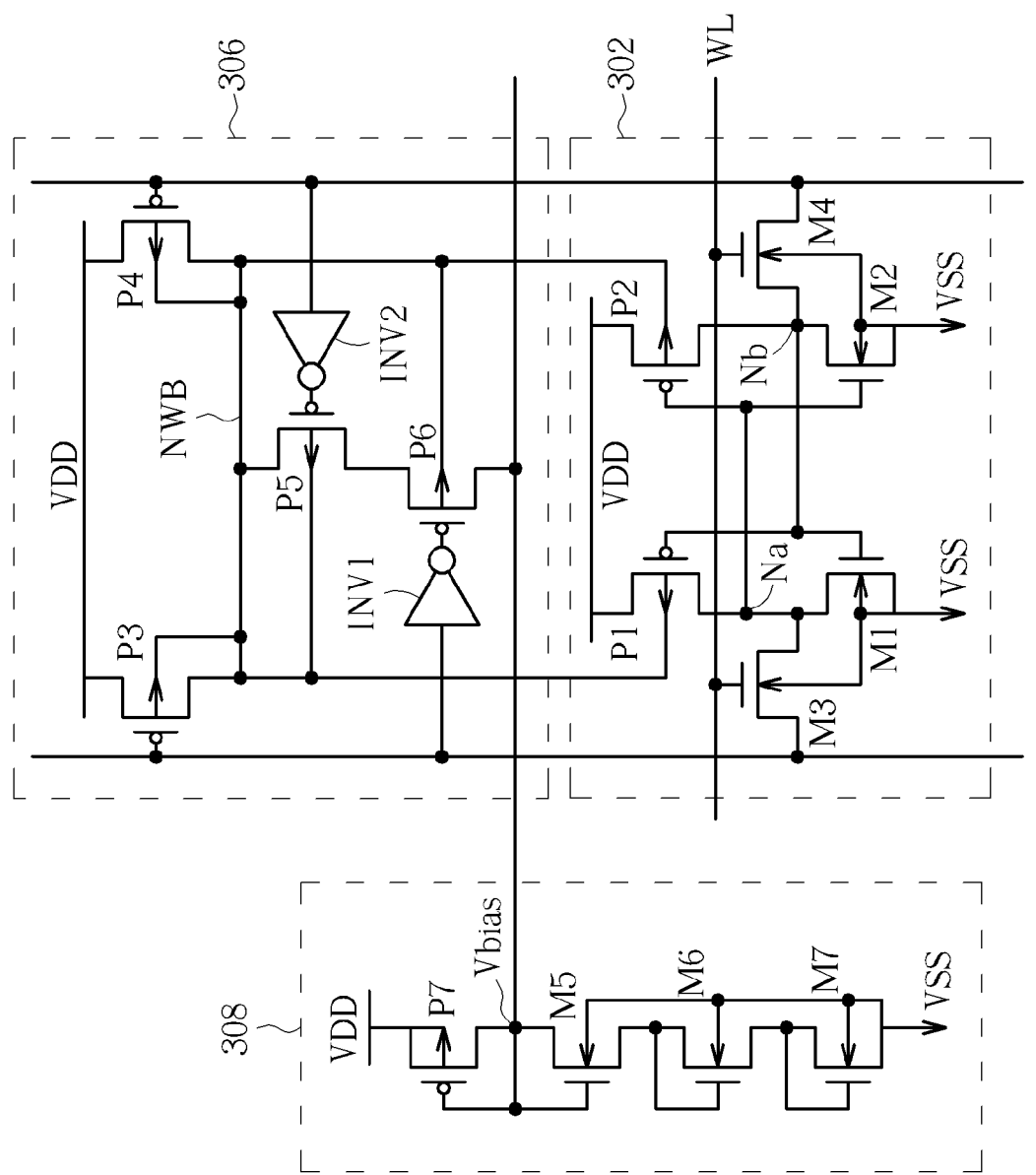
FIG. 4 is a diagram illustrating a memory cell, a voltage provider, and a voltage divider of FIG. 3 according to an embodiment of the present invention.

FIG. 4 is a diagram illustrating the memory cell 302, the voltage provider 306, and the voltage divider 308 of FIG. 3 according to an embodiment of the present invention. For brevity, only one set of circuits is shown in FIG. 4, but operations of FIG. 4 can be applied to all memory cells 302 of FIG. 3. In FIG. 4, the voltage provider 306 is disposed in the array gap 304 and the voltage divider 308 is disposed in the edge of the memory array, but the voltage divider 308 may be disposed in the array gap 304 instead. The memory cell 302 of FIG. 4 may be a 6T SRAM cell, which may include two PMOS transistors P1 and P2, two NMOS transistors M1 and M2, and two pass gate transistors M3 and M4 coupled to storage nodes Na and Nb respectively. Bodies of the two PMOS transistors P1 and P2 are coupled to the voltage provider 306 so that an N-well bias NWB of the PMOS transistors P1 and P2 may be adjusted based on whether the memory cell 302 is selected at a write cycle of the memory device 300 or not. The voltage provider 306 may include two PMOS transistors P3 and P4 coupled to a working voltage VDD and a pair of bit line BL and bit line bar BLB, two PMOS transistors P5 and P6 coupled between the PMOS transistors P3 and P4 and the voltage divider 308, and two inverters INV1 and INV2 coupled to the pair of bit line BL and bit line bar BLB and the PMOS transistors P5 and P6. The voltage divider 308 may include a PMOS transistor P7 coupled to the working voltage VDD and the PMOS transistors P6, and three NMOS transistors M5, M6, M7, each of them diode connected, coupled to the PMOS transistor P7 and a reference voltage VSS. The voltage divider 308 is used for dividing the working voltage VDD to provide a bias voltage Vbias lower than the working voltage VDD to the N-well bias NWB, where the bias voltage Vbias in this embodiment may be designed to be about 0.8*VDD or another voltage. The reference voltage VSS may be 0V and is lower than the working voltage VDD. Circuit operation of FIG. 4 under condition 1 and 2 are described below.

In condition 1, the memory cell 302 is selected at the write cycle, namely, a word line WL coupled to the NMOS transistors M3 and M4 is at a high logic level (high logic level may be the working voltage VDD), and the pair of bit line BL and bit line bar BLB coupled to the NMOS transistors M3 and M4 respectively is at inverse logic levels. For example, the bit line BL may be at the high logic level while the bit line bar BLB may be at a low logic level (low logic level may be the reference voltage VSS), and vice versa. Since under condition 1, either the bit line BL or the bit line bar BLB is at the low logic level, either the PMOS transistor P3 or P4 is turned on and the working voltage VDD is conducted through the PMOS transistor P3 or P4 to the N-well bias NWB of the PMOS transistors P1 and P2. For the same reason, either an output of the inverter INV1 or an output of the inverter INV2 is logic high, thus either the PMOS transistor P5 is turned off or P6 is turned off and a connection between the N-well bias NWB and the voltage divider 308 is blocked.

Figure 5:
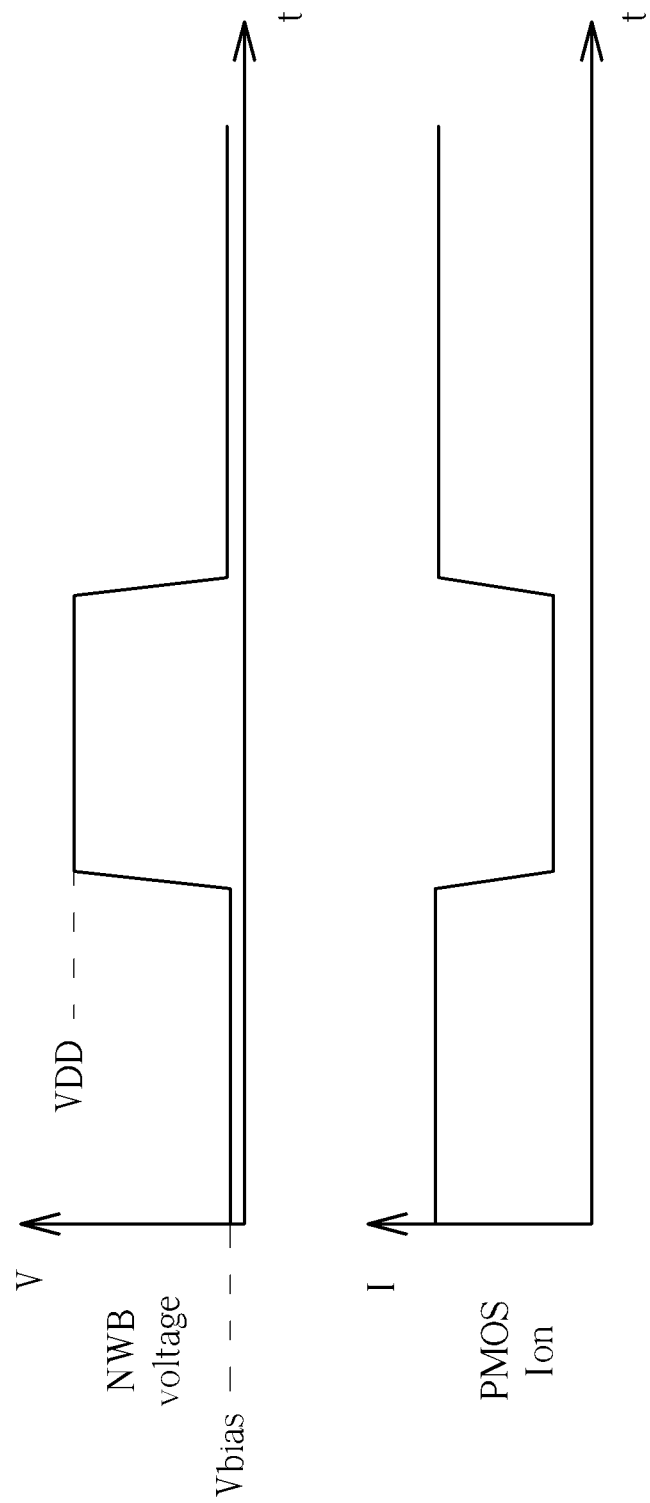
FIG. 5 is waveforms of the PMOSs' on current and the N-well bias according to an embodiment of the present invention.

FIG. 5 is waveforms of the PMOS transistors P1 and P2s' on current and the N-well bias NWB according to an embodiment of the present invention. The horizontal axis of FIG. 5 is time t, and from top to bottom of FIG. 5 are the N-well bias NWB voltage and the on current PMOS Ion. If the memory cell 302 is selected at the write cycle, the N-well bias NWB of the PMOS transistors P1 and P2 are at the working voltage VDD so that the PMOS transistors P1 and P2s' on current are reduced, thereby reducing SNM and gaining better write margin of the memory cell 302.

In condition 2, the memory cell 302 is half selected at the write cycle, namely, the word line WL coupled to the NMOS transistors M3 and M4 is at the high logic level, and the bit line BL and bit line bar BLB coupled to the NMOS transistors M3 and M4 are substantially the same. For example, the bit line BL and the bit line bar BLB may both be at the high logic level. Since under condition 2, both the bit line BL or the bit line bar BLB are at the high logic level, both the PMOS transistors P3 and P4 are turned off and a connection between the working voltage VDD and the N-well bias NWB is blocked. For the same reason, both the outputs of the inverters INV1 and INV2 are logic low, thus the PMOS transistors P5 and P6 are turned on and the bias voltage Vbias generated by the voltage divider 308 is conducted through the PMOS transistors P5 and P6 to the N-well bias NWB of the PMOS transistors P1 and P2.

As a result, if the memory cell 302 is half selected at the write cycle, the N-well bias NWB of the PMOS transistors P1 and P2 is at the bias voltage Vbias lower than the working voltage VDD so that the PMOS transistors P1 and P2s' on current are enhanced, thereby gaining better SNM of the memory cell 302 at write cycle.

Figure 6:
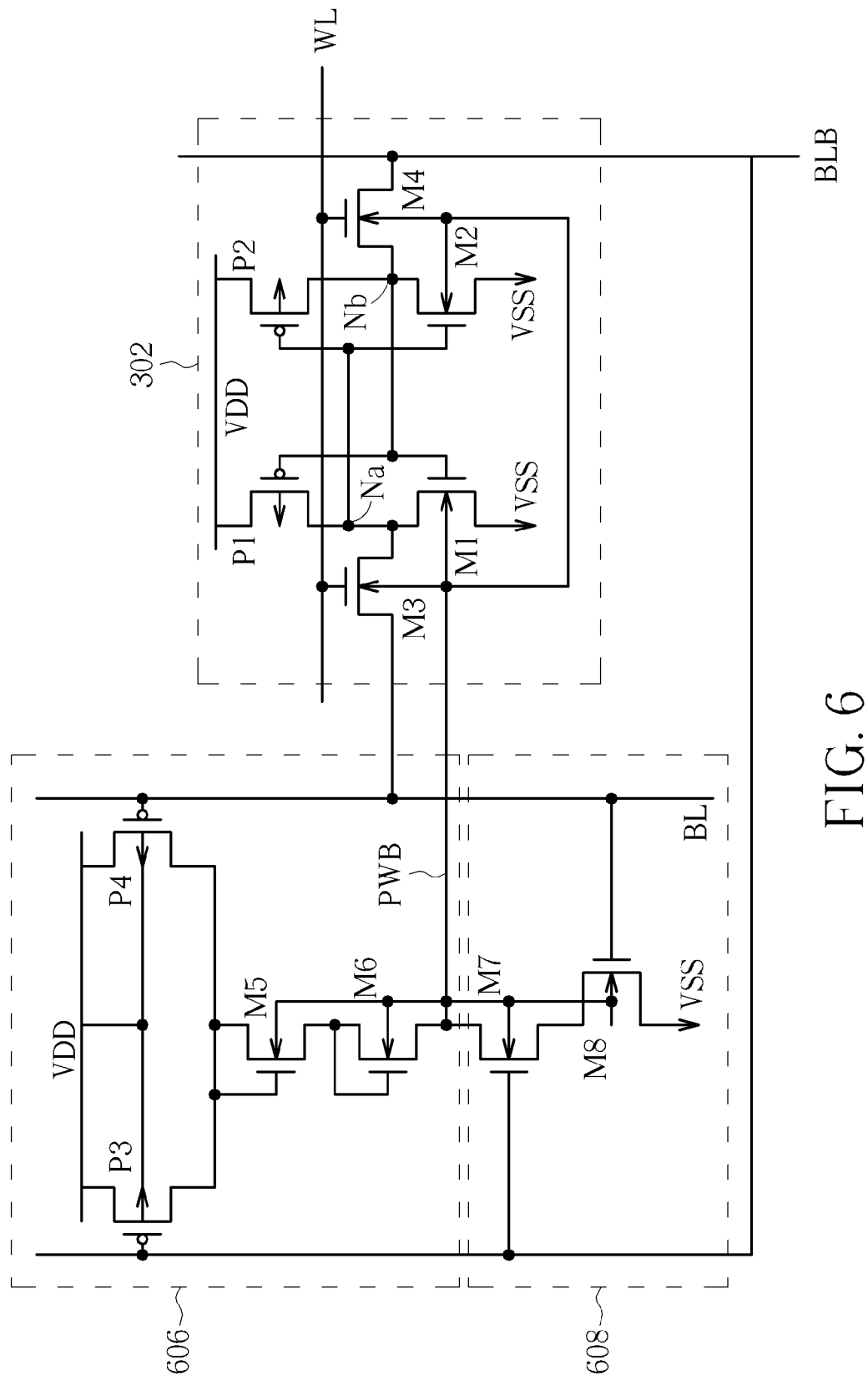
FIG. 6 is a diagram illustrating a memory cell of FIG. 3, a first voltage provider, and a second voltage provider according to another embodiment of the present invention.

FIG. 6 is a diagram illustrating the memory cell 302 of FIG. 3, a first voltage provider 606, and a second voltage provider 608 according to another embodiment of the present invention. For brevity, only one set of circuits are shown in FIG. 6, but operations of FIG. 6 can be applied to all memory cells 302 of FIG. 3. In FIG. 6, the first voltage provider 606 and the second voltage provider 608 are disposed in the edge of the memory array, but at least one of the first voltage provider 606 and the second voltage provider 608 may be disposed in the array gap 304 instead.

The memory cell 302 of FIG. 6 may include the same components as in FIG. 4. Bodies of the two NMOS transistors M1 and M2 are coupled to the first voltage provider 606 and the second voltage provider 608 so that a P-well bias PWB of the NMOS transistors M1 and M2 may be adjusted based on whether the memory cell 302 is selected at the write cycle of the memory device 300 or not. The first voltage provider 606 may include two PMOS transistors P3 and P4 coupled to the working voltage VDD and a pair of bit line BL and bit line bar BLB, and two NMOS transistors M5 and M6, each of them diode connected, coupled to the PMOS transistors P3 and P4 and the P-well bias PWB. The second voltage provider 608 may include two NMOS transistors M7 and M8 coupled to the NMOS transistors M6 and the reference voltage VSS. The first voltage provider 606 is used for providing a P-well bias voltage Vpbias higher than the reference voltage VSS to the P-well bias PWB, where the P-well bias voltage Vpbias may be designed to be about 0.2~0.3*VDD or another voltage. Circuit operation of FIG. 6 under condition 1 and 2 are described below.

In condition 1, the memory cell 302 is selected at the write cycle. Under condition 1, either the bit line BL or the bit line bar BLB is at the low logic level, either the PMOS transistor P3 or P4 is turned on and the working voltage VDD is lower by the NMOS M5 and M6 to be the P-well bias voltage Vpbias then outputted to the P-well bias PWB of the NMOS transistors M1 and M2. For the same reason, the NMOS transistor M7 is turned off or M8 is turned off and a connection between the P-well bias PWB and the reference voltage VSS is blocked.

Figure 7:
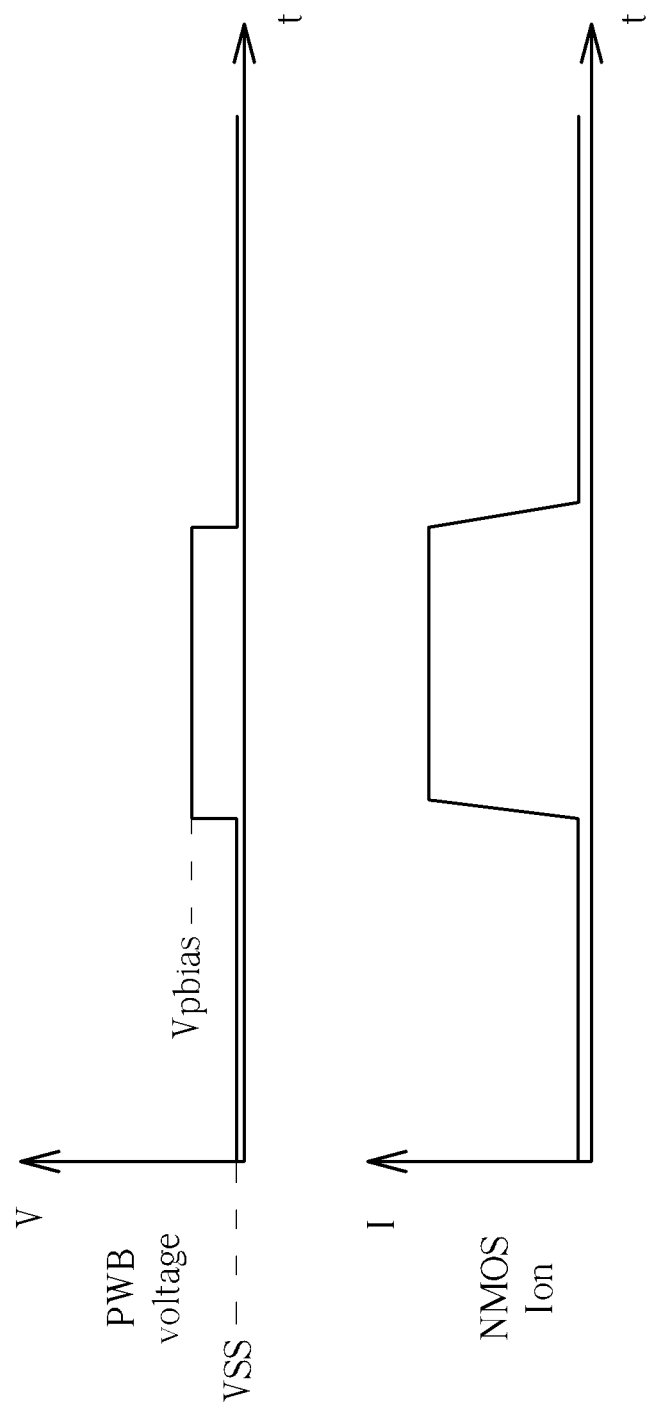
FIG. 7 is waveforms of the NMOSs' on current and the P-well bias according to another embodiment of the present invention.

FIG. 7 is waveforms of the NMOS transistors M1 and M2s' on current and the P-well bias PWB according to another embodiment of the present invention. The horizontal axis of FIG. 7 is time t, and from top to bottom of FIG. 7 are the P-well bias PWB voltage and the NMOS transistors M1 and M2s' on current NMOS Ion. If the memory cell 302 is selected at the write cycle, the P-well bias PWB of the NMOS transistors M1 and M2 are at the P-well bias voltage Vpbias so that the NMOS transistors M1 and M2s' on current are increased, thereby reducing SNM and gaining better write margin of the memory cell 302.

In condition 2, the memory cell 302 is half selected at the write cycle. Under condition 2, both the bit line BL and the bit line bar BLB are at the high logic level, thus both the PMOS transistors P3 and P4 are turned off and a connection between the working voltage VDD and the P-well bias PWB is blocked. For the same reason, both the NMOS transistors M7 and M8 are turned on and the reference voltage VSS is conducted through the NMOS transistors M7 and M8 to the P-well bias PWB of the NMOS transistors M1 and M2.

As a result, if the memory cell 302 is half selected at the write cycle, the P-well bias PWB of the NMOS transistors M1 and M2 are at the reference voltage VSS lower than the P-well bias voltage Vpbias so that the NMOS transistors M1 and M2s' on current are reduced, thereby gaining better SNM of the memory cell 302 at the write cycle.

Figure 8:
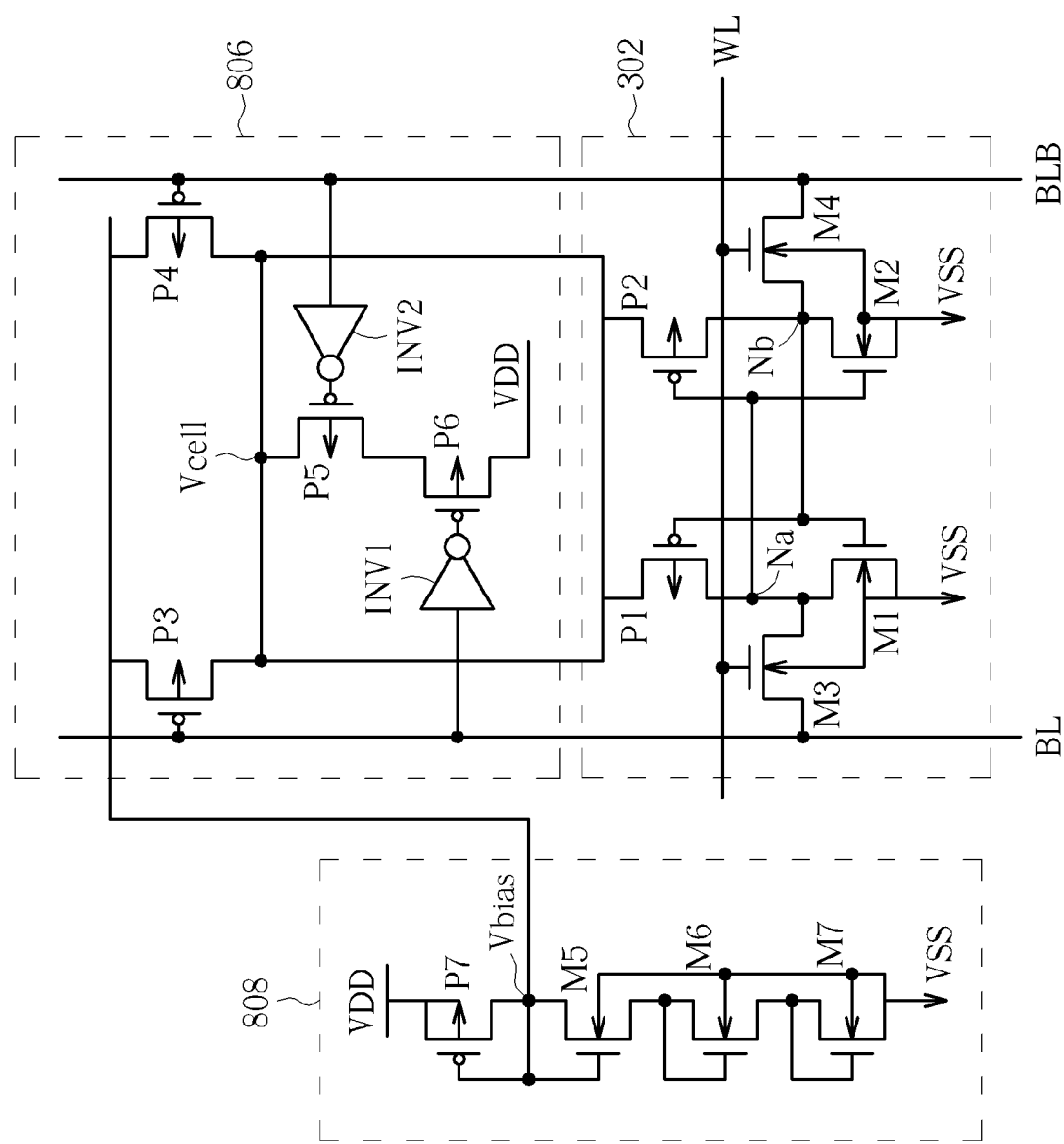
FIG. 8 is a diagram illustrating a memory cell of FIG. 3, a voltage provider, and a voltage divider according to another embodiment of the present invention.

FIG. 8 is a diagram illustrating the memory cell 302 of FIG. 3, a voltage provider 806, and a voltage divider 808 according to another embodiment of the present invention. For brevity, only one set of circuits are shown in FIG. 8, but operations of FIG. 8 can be applied to all memory cells 302 of FIG. 3. The voltage provider 806 and the voltage divider 808 may both be disposed in the array gap 304.

The memory cell 302 of FIG. 8 may include the same components as in FIG. 4. A cell working voltage Vcell of the memory cell 302 is coupled to the voltage provider 806 so that the cell working voltage Vcell maybe adjusted based on whether the memory cell 302 is selected at the write cycle of the memory device 300 or not. The PMOS transistors P1 and P2s' sources are coupled to the voltage provider 806 for receiving the cell working voltage Vcell from the voltage provider 806. The PMOS transistors P5, P6, and the inverters INV1, INV2 are utilized to sense the bit line BL and the bit line bar BLB logics. Thus the voltage divider 808 of FIG. 8 may provide the bias voltage Vbias (may be about 0.8*VDD) to be the cell working voltage Vcell when the memory cell 302 is selected at the write cycle, and the voltage provider 806 of FIG. 8 may provide the working voltage VDD to be the cell working voltage Vcell when the memory cell 302 is half selected at the write cycle.

Figure 9:
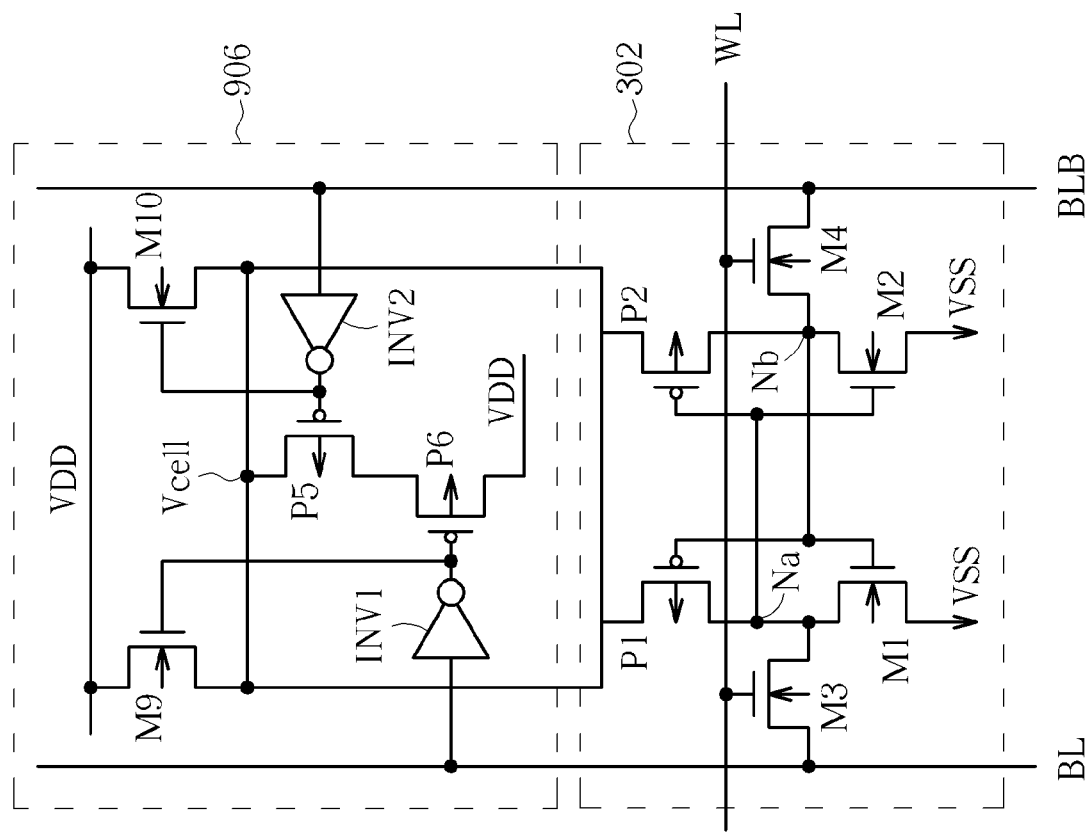
FIG. 9 is a diagram illustrating a memory cell of FIG. 3 and a voltage provider according to another embodiment of the present invention.

FIG. 9 is a diagram illustrating the memory cell 302 of FIG. 3 and a voltage provider 906 according to another embodiment of the present invention. For brevity, only one set of circuits are shown in FIG. 9, but operations of FIG. 9 can be applied to all memory cells 302. The voltage provider 906 may be disposed in the array gap 304.

The cell working voltage Vcell of the memory cell 302 is coupled to the voltage provider 906 so that the cell working voltage Vcell may be adjusted based on whether the memory cell 302 is selected at the write cycle of the memory device 300 or not. Two low threshold voltage NMOS transistors M9 and M10 are coupled to the working voltage VDD. The control ends of the NMOS transistors M9 and M10 are coupled to the inverters INV1 and INV2 respectively. The voltage provider 906 may provide a voltage lower than the working voltage VDD via voltage drop of either M9 or M10 to be the cell working voltage Vcell when the memory cell 302 is selected at the write cycle. The voltage provider 906 may provide the working voltage VDD to be the cell working voltage Vcell when the memory cell 302 is half selected at the write cycle.

Figure 10:
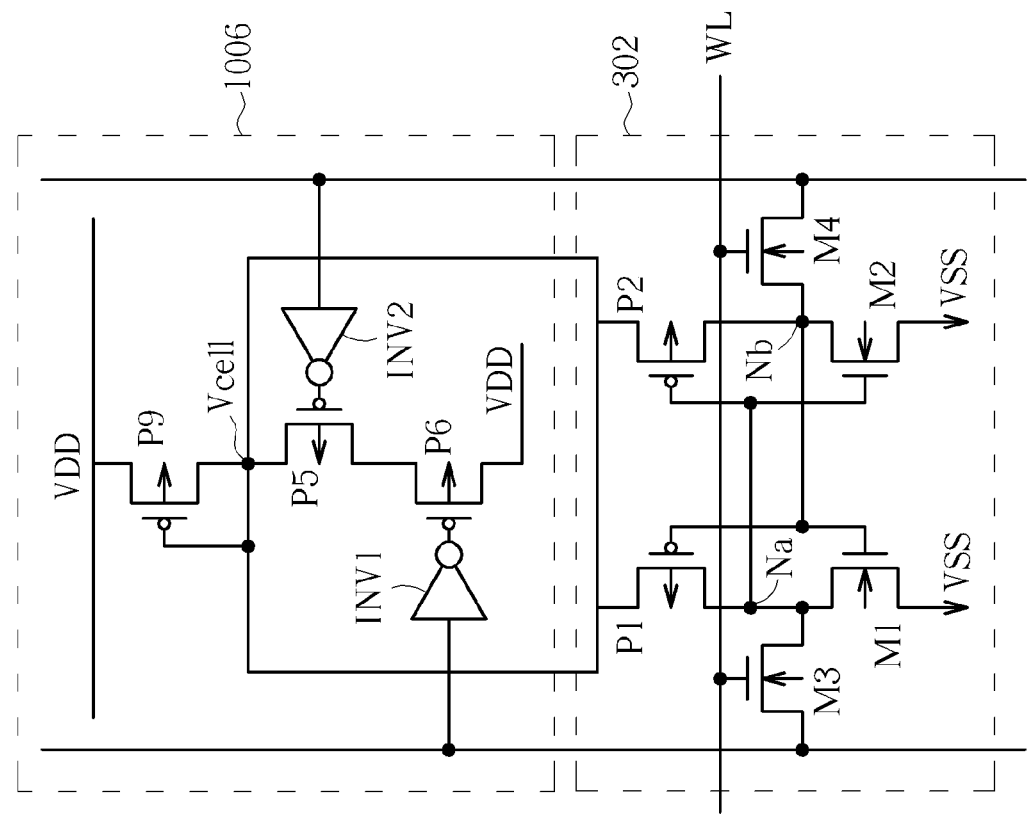
FIG. 10 is a diagram illustrating a memory cell of FIG. 3 and a voltage provider according to another embodiment of the present invention.

FIG. 10 is a diagram illustrating the memory cell 302 of FIG. 3 and a voltage provider 1006 according to another embodiment of the present invention. The voltage provider 906 of FIG. 9 is replaced by the voltage provider 1006 of FIG. 10. The voltage provider 1006 works in a similar manner as FIG. 9, except that the NMOS transistors M9 and M10 are replaced by a PMOS transistor P9 in FIG. 10. The PMOS transistor P9 is coupled to the working voltage VDD and the PMOS transistor P5. When the memory cell 302 is selected at the write cycle, a connection between Vcell and the working voltage VDD is block because either P5 or P6 is turned off and Vcell is floating. Next when WL goes high to turn on M3 and M4, Vcell will be pulled down through P1, M3 to BL's potential, for example if a low logic level is written through BL, Vcell will be pulled down to the low logic level. Meanwhile, the PMOS P9 is used to hold Vcell at around VDD-Vt level to avoid Vcell being too low which might induce data retention issue on other memory cells at the same column with the memory cell 302. The voltage provider 1006 may provide the working voltage VDD to be the cell working voltage Vcell when the memory cell 302 is half selected at the write cycle.

Figure 11:
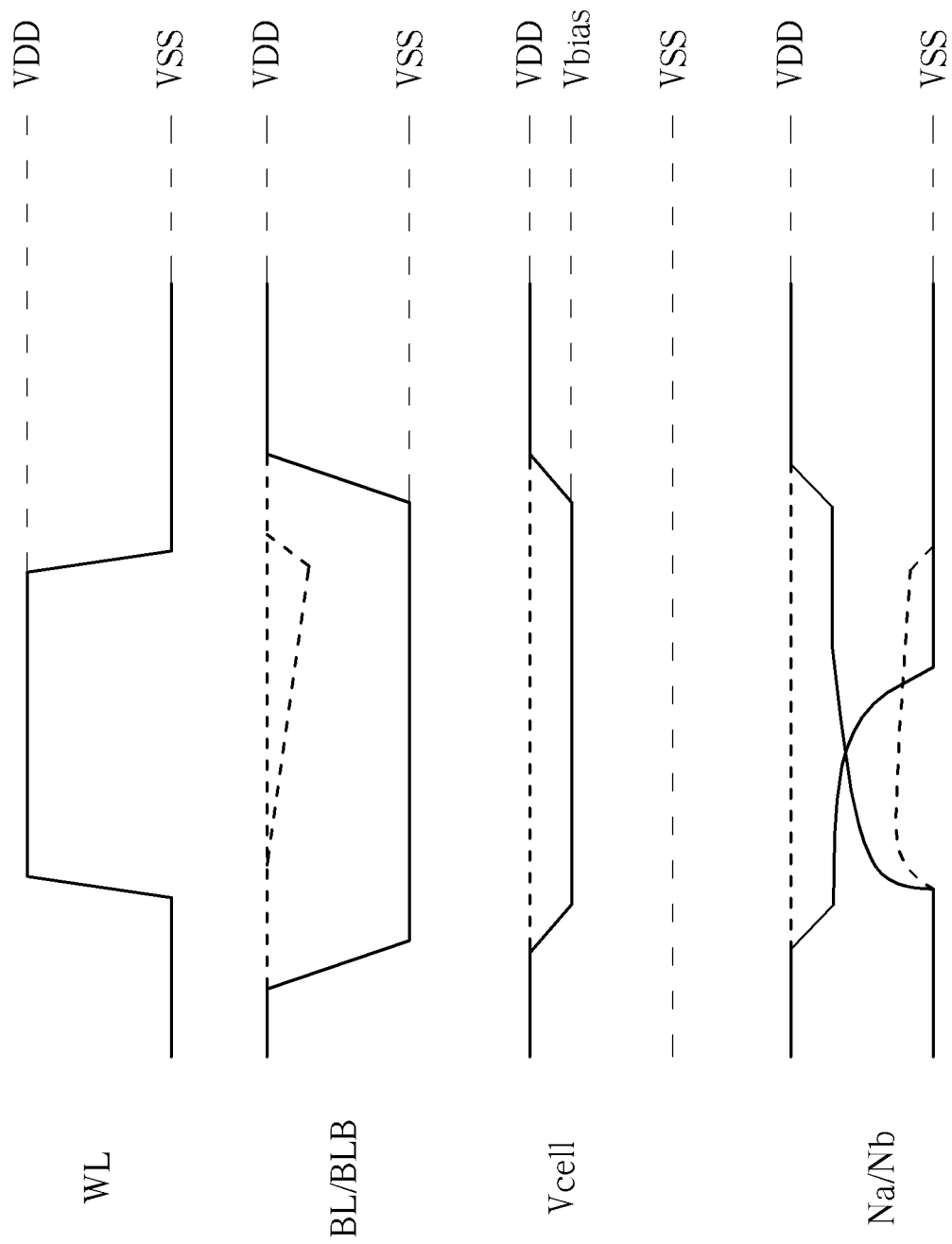
FIG. 11 is a diagram illustrating operations of FIG. 8 according to an embodiment of the present invention.

FIG. 11 is a diagram illustrating operations of FIG. 8 according to an embodiment of the present invention. The horizontal axis of FIG. 11 is time t. From top to bottom of FIG. 11 are the word line WL voltage, the bit line BL or the bit line bar BLB voltages, the memory cells 302 working voltages Vcell, and storage nodes Na and Nb voltages. The storage nodes Na and Nb are at inverse logic levels. Solid lines in FIG. 11 indicate waveforms of the select cell 302 at the write cycle, whereas dashed lines in FIG. 11 indicate waveforms of half select cells 302 of other columns of memory cells 302. A method for controlling the memory device 300 is as following. If one of the memory cells 302 of the column of memory cells 302 of FIG. 8 is selected at the write cycle, the voltage provider 806 provides the bias voltage Vbias lower than the working voltage VDD to be the select memory 302's cell working voltage Vcell. In the mean time, voltage providers 806 of the other columns of memory cells 302 provide the working voltages VDD to be the half select memory 302's cell working voltages Vcell of the other columns of memory cells 302. Thus a voltage difference between the high logic and the low logic of the storage node Na or Nb of the select memory cell 302 is lowered, thereby enhancing write ability of the select memory cell 302. On the other hand, the storage nodes Na or Nb of the half select cells 302 are still at the working voltage VDD, thereby keeping a relatively good SNM comparing with the select cell 302.

Figure 12:
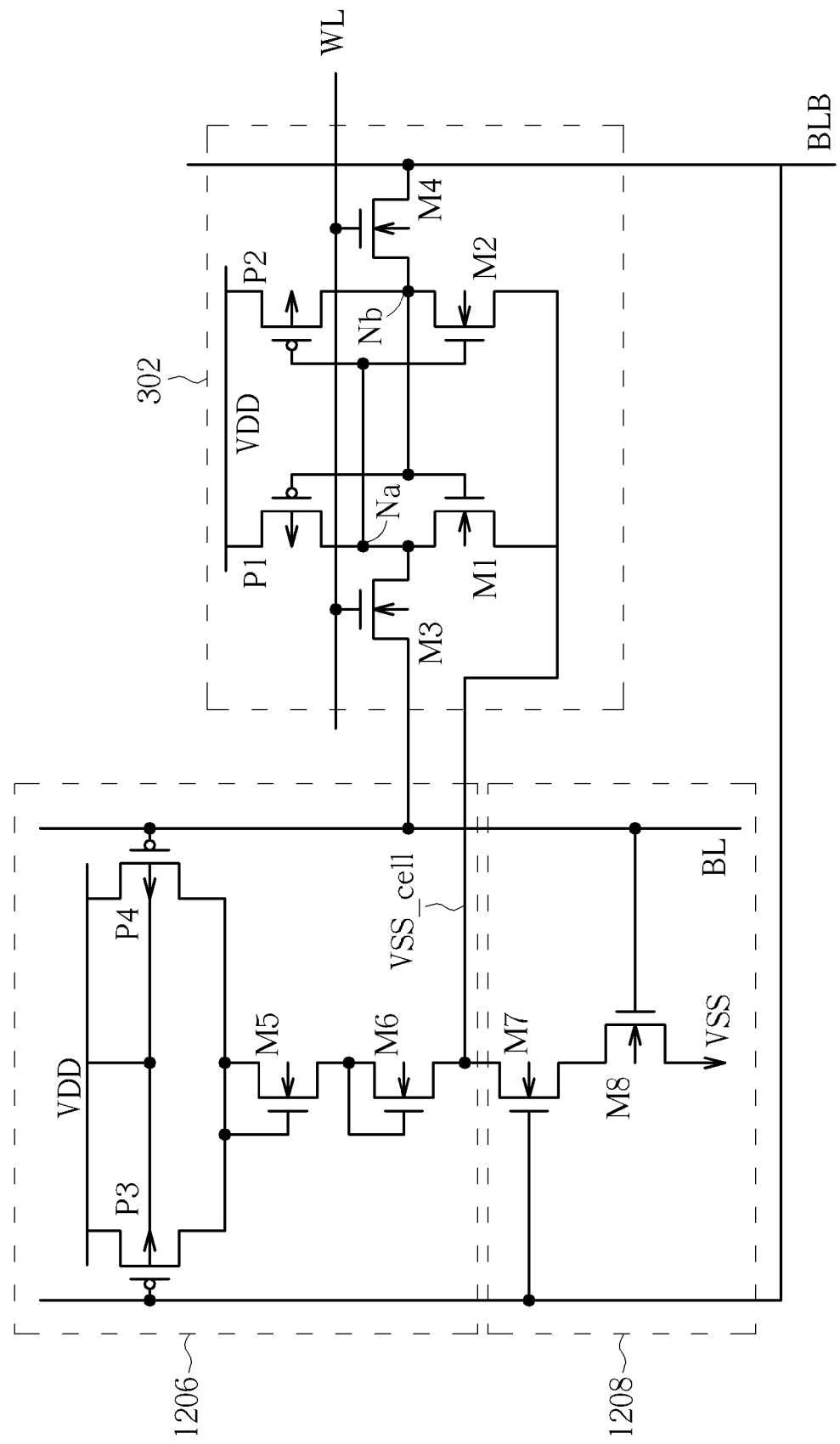
FIG. 12 is a diagram illustrating a memory cell of FIG. 3, a first voltage provider, and a second voltage provider according to another embodiment of the present invention.

FIG. 12 is a diagram illustrating the memory cell 302 of FIG. 3, a first voltage provider 1206, and a second voltage provider 1208 according to another embodiment of the present invention. The first voltage provider 1206 and the second voltage provider 1208 may include the same components as in FIG. 6 and works in an analogous manner as FIG. 6, except that the first voltage provider 1206 of FIG. 12 provides a bias voltage Vsbias to be a cell reference voltage VSS_cell, which is higher than the reference voltage VSS, when the memory cell 302 is selected at the write cycle. The NMOS transistors M1 and M2s' sources are coupled to the first voltage provider 1206 and the second voltage provider 1208 for receiving the cell reference voltage VSS_cell from them. The first voltage provider 1206 may provide the bias voltage Vsbias to be the cell reference voltage VSS_cell when the memory cell 302 is selected at the write cycle, and the second voltage provider 1208 may provide the reference voltage VSS to be the cell reference voltage VSS_cell when the memory cell 302 is half selected at the write cycle.

Figure 13:
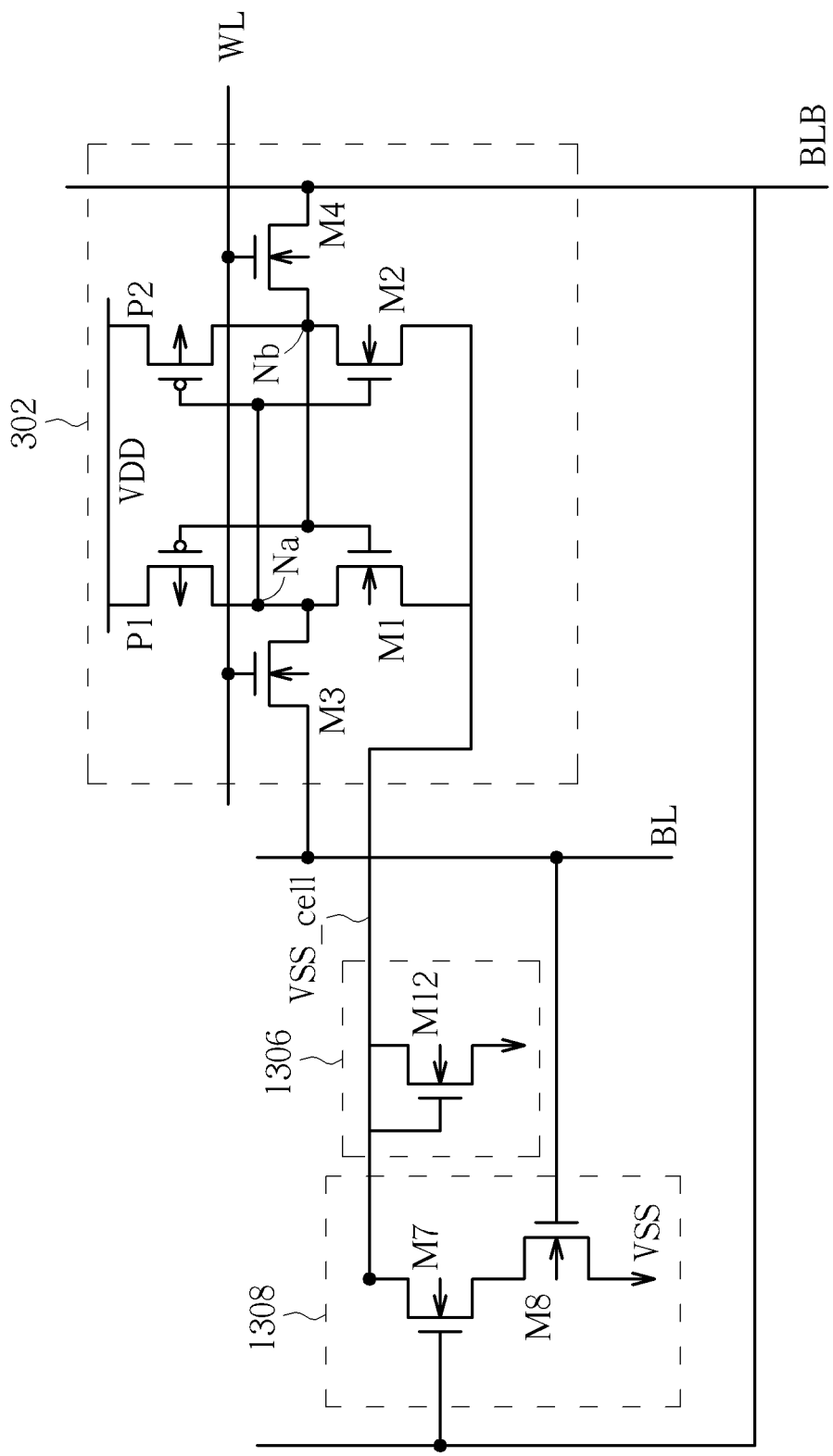
FIG. 13 is a diagram illustrating a memory cell of FIG. 3, a first voltage provider, and a second voltage provider according to another embodiment of the present invention.

FIG. 13 is a diagram illustrating the memory cell 302 of FIG. 3, a first voltage provider 1306, and a second voltage provider 1308 according to another embodiment of the present invention. The second voltage provider 1308 works in an analogous manner as FIG. 12. The first voltage provider 1306 may include an NMOS transistor M12 for providing a bias voltage Vsbias to be the cell reference voltage VSS_cell when the memory cell 302 is selected at the write cycle, and the second voltage provider 1308 may provide the reference voltage VSS to be the cell reference voltage VSS_cell when the memory cell 302 is half selected at the write cycle.

Figure 14:
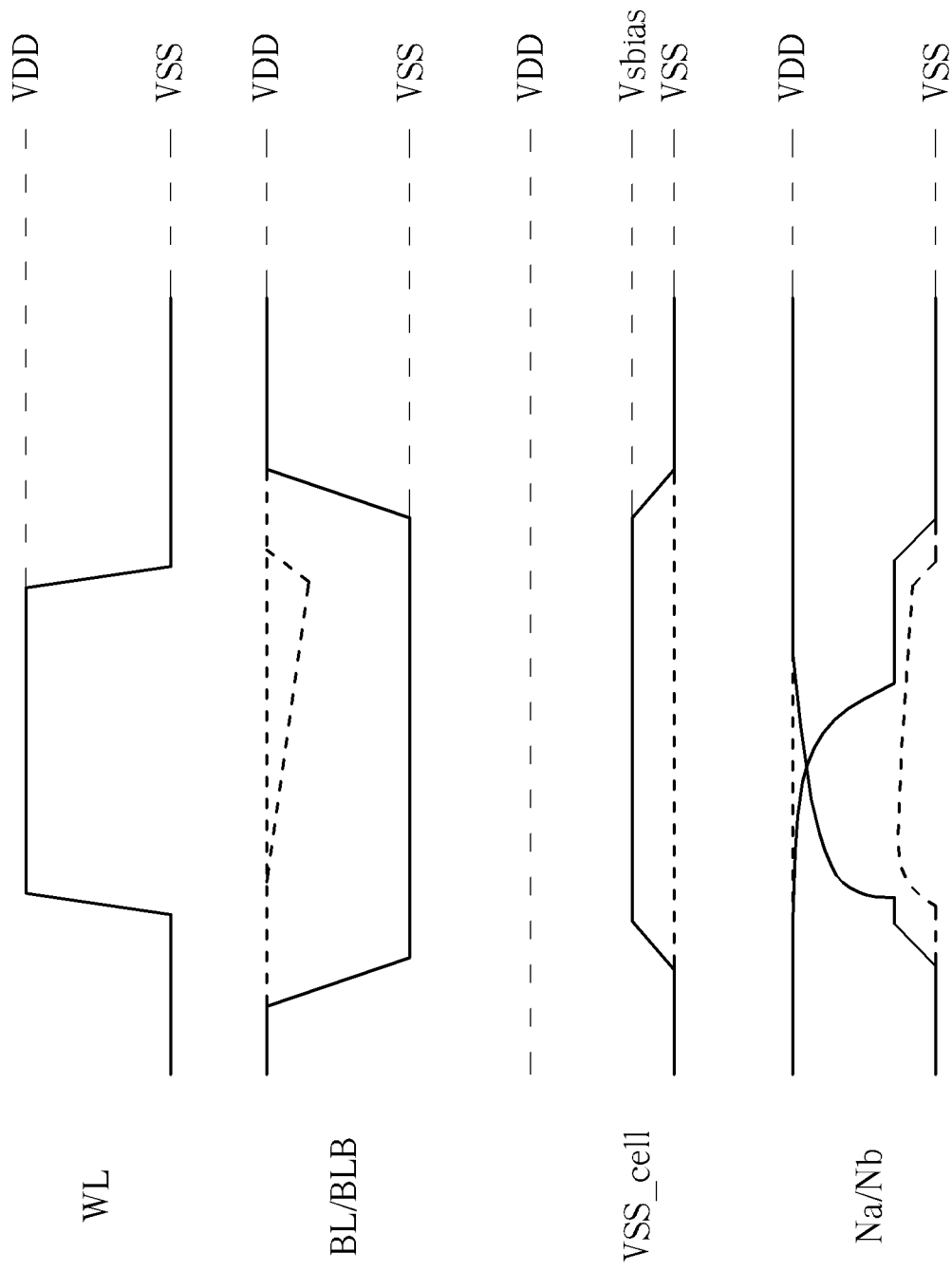
FIG. 14 is a diagram illustrating operations of FIG. 12 according to an embodiment of the present invention.

FIG. 14 is a diagram illustrating operations of FIG. 12 according to an embodiment of the present invention. A method for controlling the memory array composed of the columns of memory cells 302 of FIG. 12 according to FIG. 14 is as following. If one of the memory cells 302 of the column of memory cells 302 of FIG. 12 is selected at the write cycle, the first voltage provider 1206 provides a bias voltage Vsbias higher than the reference voltage VSS to be the select memory cell 302's cell reference voltage VSS_cell. In the mean time, the second voltage provider 1208 of the other columns of memory cells 302 provide the reference voltage VSS to the half select memory cells 302s' cell reference voltages VSS-_cell of other columns of memory cells 302. Thus a voltage difference between the high logic and the low logic of the storage node Na or Nb of the select memory cell 302 is lowered, thereby enhancing write ability of the select memory cell 302. On the other hand, the storage nodes Na or Nb of the half select cells 302 are still at the working voltage VDD, thereby keeping a relatively good SNM comparing with the select cell 302.

Figure 15:
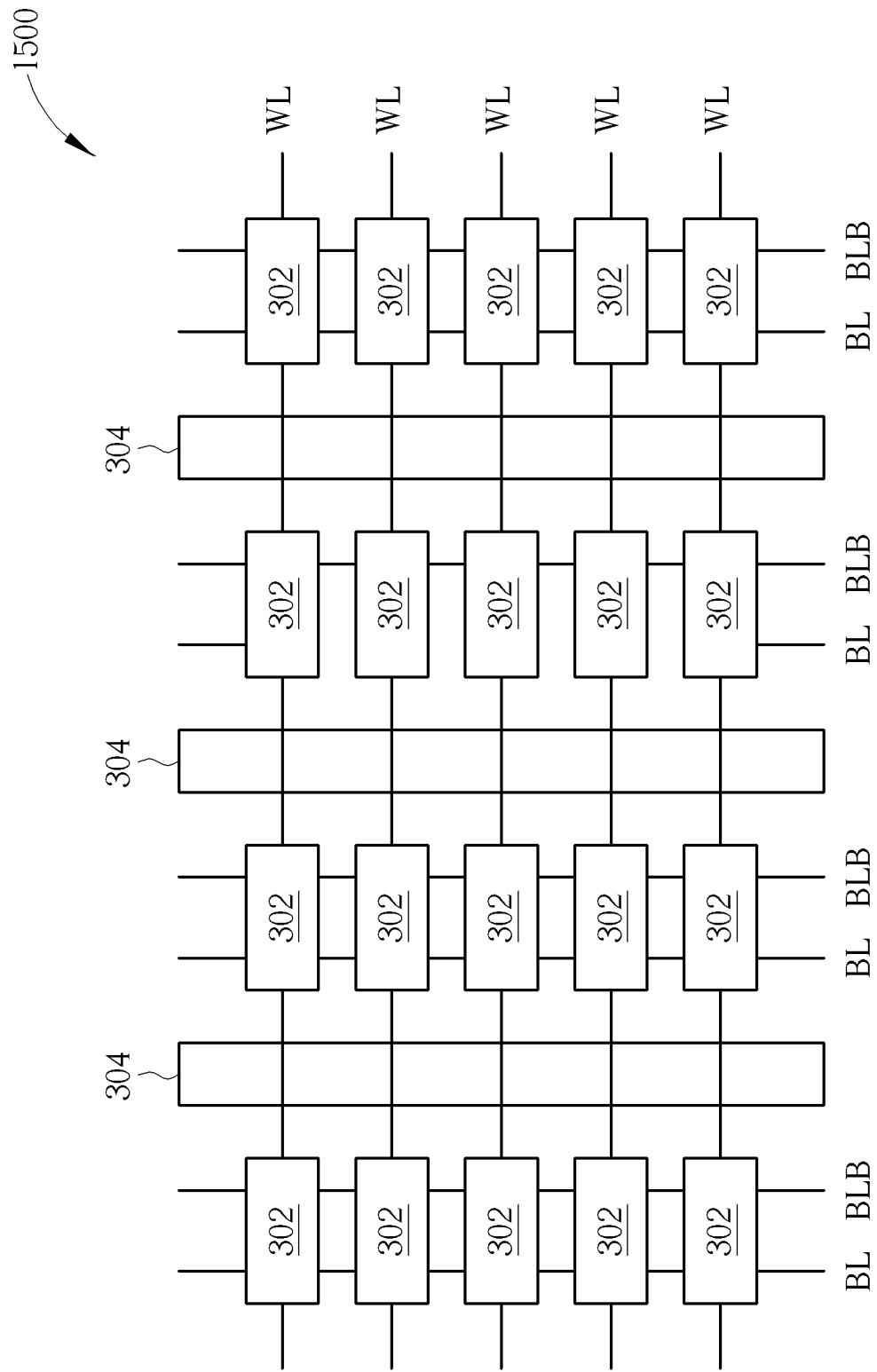
FIG. 15 is a diagram illustrating a memory device according to another embodiment of the present invention.

FIG. 15 is a diagram illustrating a memory device 1500 according to another embodiment of the present invention. In the memory device 1500, the array gap 304 is arranged between columns of the memory cells 302 of the memory array. All aforementioned embodiments may be applied to FIG. 15 as well.

In summary, the present invention discloses circuit structures and methods for enhancing write ability of the select cell while keeping relatively good SNM of the half select cells and off cells by sensing the bit line BL and the bit line bar BLB coupled to the select cell to independently and automatically adjusting body bias or adjusting power source voltage, in order to accomplish write and/or read assist of the memory device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device comprising:
    a memory array comprising:
        a plurality of columns of memory cells, each memory cell of the columns of memory cells comprising a plurality of PMOS (P-type metal oxide semiconductor) switches;
    an array gap;
    a voltage provider disposed in the array gap coupled to N-wells of PMOS switches of each memory cell of a column of memory cells of the plurality of columns of memory cells for providing a first voltage to the N-wells when a logic level of a bit line coupled to the column of memory cells and a logic level of a bit line bar coupled to the column of memory cells are inverse to one another; and
    a voltage divider coupled to the voltage provider and the N-wells for dividing the first voltage to provide a second voltage lower than the first voltage to the N-wells when the logic level of the bit line and the logic level of the bit line bar are substantially the same.

2. The memory device of claim 1 wherein the voltage divider is disposed in the array gap.

3. The memory device of claim 1 wherein each memory cell of the column of memory cells is a non-volatile memory cell.

4. The memory device of claim 1 wherein each memory cell of the column of memory cells is an SRAM cell.

5. A memory device comprising:
    a memory array comprising:
        a plurality of columns of memory cells, each memory cell of the columns of memory cells comprising a plurality of NMOS (N-type metal oxide semiconductor) switches;
    an array gap;
    a first voltage provider disposed in the array gap coupled to P-wells of NMOS switches of each memory cell of a column of memory cells of the plurality of columns of memory cells for providing a first voltage to the P-wells when a logic level of a bit line coupled to the column of memory cells and a logic level of a bit line bar coupled to the column of memory cells are inverse to one another; and
    a second voltage provider coupled to the P-wells for providing a second voltage lower than the first voltage to the P-wells when the logic level of the bit line and the logic level of the bit line bar are substantially the same.

6. The memory device of claim 5 wherein the second voltage provider is disposed in the array gap.

7. The memory device of claim 5 wherein each memory cell of the column of memory cells is a non-volatile memory cell.

8. The memory device of claim 5 wherein each memory cell of the column of memory cells is an SRAM cell.

9. A memory device comprising:
    a memory array comprising:
        a plurality of columns of memory cells, each memory cell of the columns of memory cells comprising a plurality of PMOS (P-type metal oxide semiconductor) switches;
    an array gap;

a voltage provider disposed in the array gap coupled to sources of PMOS switches of each memory cell of a column of memory cells of the plurality of columns of memory cells for providing a first voltage to the sources when a logic level of a bit line coupled to the column of memory cells and a logic level of a bit line bar coupled to the column of memory cells are substantially the same; and a voltage divider coupled to the voltage provider and the sources for dividing the first voltage to provide a second voltage lower than the first voltage to the sources when the logic level of the bit line and the logic level of the bit line bar are inverse to one another.

10. The memory device of claim 9 wherein the voltage divider is disposed in the array gap.

* * * * *